(12) United States Patent
Esefelder et al.

(10) Patent No.: US 12,015,379 B2
(45) Date of Patent: Jun. 18, 2024

(54) DEVICE FOR ELECTRICALLY CONTACTING A SOLAR CELL DURING THE MEASUREMENT OF ELECTRICAL CHARACTERISTICS OF THE SOLAR CELL, AND METHOD FOR MEASURING ELECTRICAL CHARACTERISTICS OF A SOLAR CELL

(71) Applicant: WAVELABS SOLAR METROLOGY SYSTEMS GmbH, Leipzig (DE)

(72) Inventors: Sascha Esefelder, Leipzig (DE); Falk Wildgrube, Leipzig (DE); Torsten Brammer, Leipzig (DE); Wolfgang Zemitzsch, Leipzig (DE)

(73) Assignee: WAVELABS SOLAR METROLOGY SYSTEMS GMBH, Leipzig (DE)

( * ) Notice: Subject to any disclaimer, the term of this patent is extended or adjusted under 35 U.S.C. 154(b) by 886 days.

(21) Appl. No.: 16/967,768

(22) PCT Filed: Feb. 8, 2019

(86) PCT No.: PCT/DE2019/100126
§ 371 (c)(1),
(2) Date: Aug. 6, 2020

(87) PCT Pub. No.: WO2019/154464
PCT Pub. Date: Aug. 15, 2019

(65) Prior Publication Data
US 2020/0366240 A1    Nov. 19, 2020

(30) Foreign Application Priority Data
Feb. 8, 2018    (DE) ................. 10 2018 102 840.7

(51) Int. Cl.
*H02S 50/10*        (2014.01)
*H01L 31/0224*      (2006.01)
*H01L 31/05*        (2014.01)

(52) U.S. Cl.
CPC ...... *H02S 50/10* (2014.12); *H01L 31/022425* (2013.01); *H01L 31/0504* (2013.01)

(58) Field of Classification Search
CPC ............ H02S 50/10; H01L 31/022425; H01L 31/0504
See application file for complete search history.

(56) References Cited

U.S. PATENT DOCUMENTS

| 2007/0068567 A1 | 3/2007 | Rubin et al. |
| 2007/0235077 A1* | 10/2007 | Nagata ............. B32B 17/10788 |
| | | 136/256 |
| 2014/0347087 A1 | 11/2014 | Wirth et al. |

FOREIGN PATENT DOCUMENTS

| DE | 102011008261 A1 | 7/2012 |
| DE | 102011081004 A1 | 2/2013 |

(Continued)

OTHER PUBLICATIONS

English Translation of PCT/DE2019/100126 (Year: 2019).*

(Continued)

*Primary Examiner* — Paresh Patel
(74) *Attorney, Agent, or Firm* — Heslin Rothenberg Farley & Mesiti P.C.

(57) ABSTRACT

A device for electrically contacting a solar cell during the measurement of electrical characteristics of the solar cell, which has a plurality of finger electrodes on its surface, has at least one measuring strip that has at least one contact terminal for electrically contacting a solar cell test device and that extends between two measuring-strip end portions in a measuring-strip extension direction. The measuring strip has a plurality of loop-like or hook-like contact spring (Continued)

portions formed integrally with the measuring strip, which are positioned on the measuring strip along the measuring-strip extension direction. The contact has at least one finger electrode by spring-elastic mechanical contact, when the measuring strip is placed on the surface of the solar cell. A measuring frame includes opposing frame-edge struts, which engages, using the frame-edge struts, around an area that is greater than or equal to a solar cell to be measured, and in which the measuring strip is braced.

14 Claims, 6 Drawing Sheets

(56) References Cited

FOREIGN PATENT DOCUMENTS

| EP | 2875366 A1 | 5/2015 |
|---|---|---|
| KR | 200455080 Y1 | 8/2011 |
| KR | 1020140019804 A | 2/2014 |
| WO | 2012095275 A1 | 7/2012 |
| WO | 2012127411 A1 | 9/2012 |
| WO | 2014013350 A1 | 1/2014 |

OTHER PUBLICATIONS

International Search Report (and English translation) and Written Opinion of the International Searching Authority for International Application No. PCT/DE2019/100126 dated Jun. 27, 2019.

\* cited by examiner

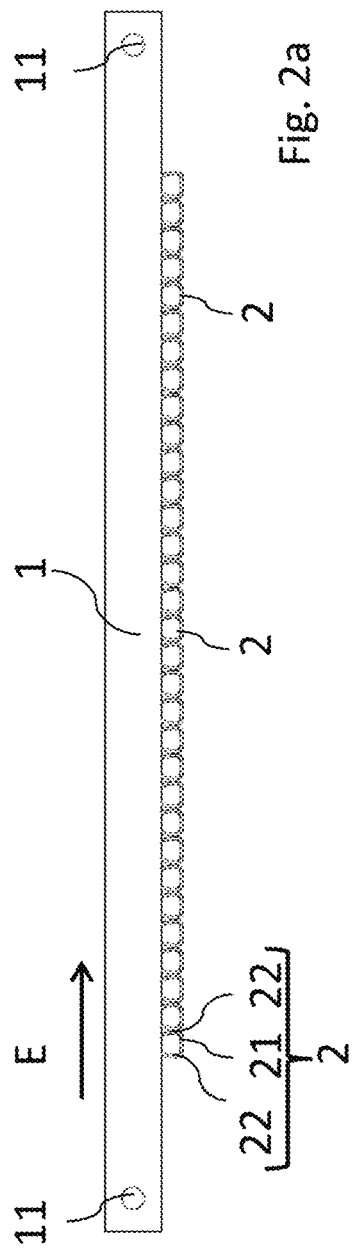
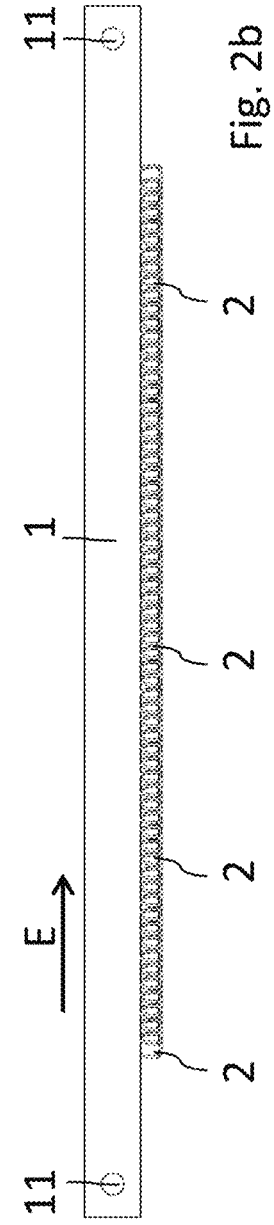
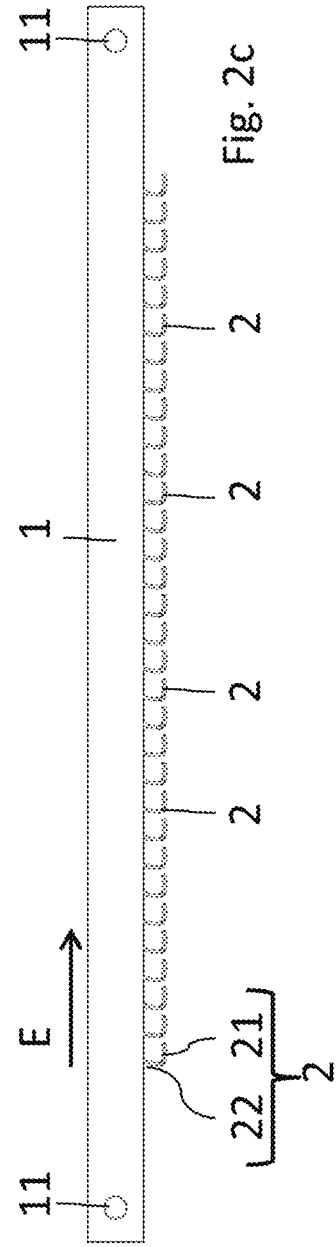

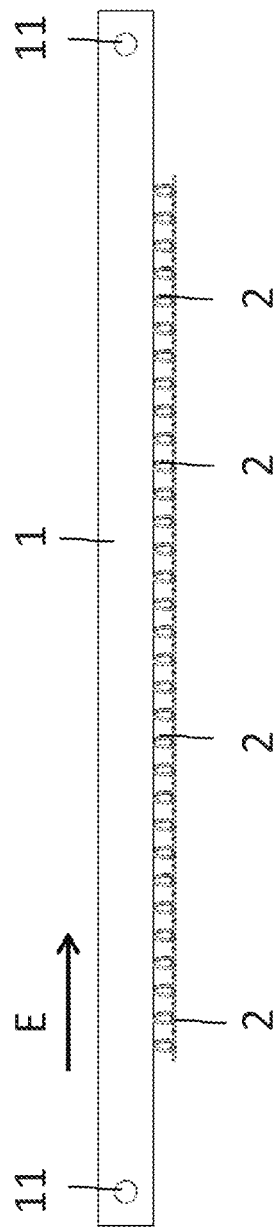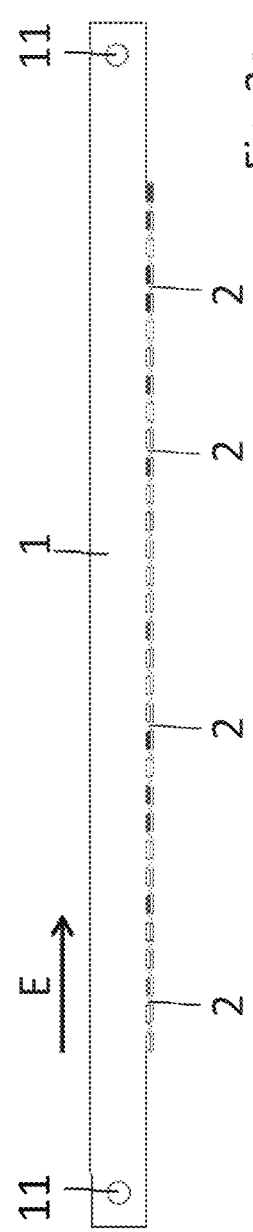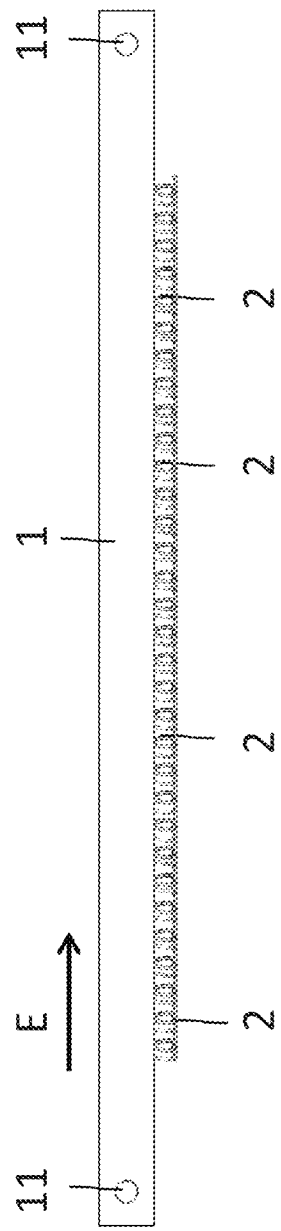

DEVICE FOR ELECTRICALLY CONTACTING A SOLAR CELL DURING THE MEASUREMENT OF ELECTRICAL CHARACTERISTICS OF THE SOLAR CELL, AND METHOD FOR MEASURING ELECTRICAL CHARACTERISTICS OF A SOLAR CELL

CROSS REFERENCE TO RELATED APPLICATIONS

This application is a national stage filing under section 371 of International Application No. PCT/DE2019/100126, filed on Feb. 8, 2019, published on Aug. 15, 2019 as WO 2019/154464 A1 which claims priority to German Patent Application No. 10 2018 102 840.7, filed on Feb. 8, 2018. The entire disclosure of each application is hereby incorporated herein by reference.

BACKGROUND

The invention relates to a device for electrically contacting a solar cell during the measurement of electrical characteristics of the solar cell, and to a method for measuring electrical characteristics of a solar cell. In particular, the invention relates to a device and a method for measuring the electrical characteristics of the solar cell, wherein the solar cell is embodied with a multiplicity of finger electrodes on a solar cell surface, but does not have a busbar.

US2007/0068567A1 describes a device for electrically contacting a solar cell during the measurement of electrical characteristics of the solar cell, which comprises two measuring strips extending between two measuring strip end sections in a measuring strip extension direction, wherein each measuring strip has at least one contact terminal for electrical contacting with a solar cell test device. The device furthermore comprises a plurality of contact spring sections arranged on each measuring strip along the measuring strip extension direction, wherein each contact spring section is configured to electrically contact at least one finger electrode by spring-elastic mechanical contact when the measuring strip is placed onto the solar cell surface, with the measuring strip extension direction oriented transversely with respect to the finger electrodes. In order to measure electrical characteristics of the solar cell, the solar cell is held in the device, wherein the contact spring sections are pressed onto the finger electrodes of the solar cell. The solar cell surface is exposed to light, with the result that the generated photocurrent flows through the finger electrodes of the solar cell, and is collected and measured by way of the contact spring sections in electrical contact with the finger electrodes and the measuring strips. The contact spring sections are embodied as elongated elastic elements, for example as flexible metal wire mesh material or as metallic hollow-cylindrical elements. One problem of this device known from the prior art is that the measuring strips shade the solar cell surface relatively broadly as viewed transversely with respect to their measuring strip extension direction. The shading of the measuring strips that is generated as a result is often significantly greater than the shading generated by cell connectors in the solar module, with the result that the measurement carried out is not very realistic. At the transitions between contact spring sections and measuring strip, on account of electrochemically different materials, additional contact resistances and/or contact potentials can occur, which influence the measurement results. Moreover, there is still a need for a simultaneously more cost-effective solution for an improved device and an optimized measuring method carried out therewith.

SUMMARY OF THE INVENTION

The object of the invention is to provide a device for electrically contacting a solar cell during the measurement of electrical characteristics of the solar cell and a method for measuring electrical characteristics of a solar cell which enable a more realistic measurement and do so simultaneously more cost-effectively.

The object of the invention is achieved by means of a device having the features of patent claim 1 and a method having the features of patent claim 8. The dependent claims relate to advantageous developments and modifications The invention provides for the measuring strip and the contact spring sections to be embodied from the same material and integrally, wherein each contact spring section is embodied in a looped or hooked fashion as viewed transversely with respect to the measuring strip extension direction, and for the measuring frame to have a mechanical tension device, in which the measuring strip is clamped under tensile stress between the frame edge struts situated opposite one another.

The integral embodiment of the measuring strip and the contact spring sections results in the measuring strip and the contact spring sections being connected to one another mechanically stably and the clamping of the measuring strip in the tension device under tensile stress ensures a mechanical stability of the measuring strip particularly upon the latter being pressed onto the solar cell surface. The measuring frame is preferably adapted to a form, shape and dimensions of customary wafer solar cell types.

Furthermore, the integral construction of measuring strip and contact spring sections ensures an electrically low-resistance transition between these two structural sections of the measuring strip. At the same time, the contact spring sections can be elastically deformed in a manner materially dependent on the material used. In this configuration, the securing of the contact spring sections to the measuring strip has no mechanical weak points such as, for example, a soldering, clamping, adhesive-bonding or welding connection. As a result, the device is less susceptible to damage and repair since there is a lower probability of contact spring sections detaching from the measuring strip as a result of intensive use and/or incorrect handling. Moreover, the measuring strip together with contact spring sections can be produced cost-effectively since only one component part is required, rather than a plurality of component parts. Moreover, the measuring strip with the contact spring sections embodied in a looped or hooked fashion can be made significantly narrower as viewed transversely with respect to the measuring strip extension direction. In this way, the shading during the measuring process is reduced such that a measurement adapted to the real dimensions of a solar cell string in the solar module can be performed.

Each contact spring section is embodied in a looped or hooked fashion as viewed transversely with respect to the measuring strip extension direction. The contact spring section preferably has a spring part and a contact part. The spring part is arranged at the lower edge of the measuring strip, the spring part extending perpendicularly or substantially perpendicularly to the measuring strip extension direction proceeding from the lower edge of the measuring strip. The geometric-structural configuration of the spring part determines the spring force that is necessary in order to elastically deform the contact part integrally adjacent to the spring part during the movement into a contacting position in which the contact spring section electrically contacts at least one finger electrode by spring-elastic mechanical contact when the measuring strip is placed onto the solar cell surface. The geometry of the contact part of the contact spring section determines the electrical contact area and likewise influences the spring force that is necessary for the elastic deformation of the contact spring section. The contact part is configured such that when the measuring strip is placed onto the solar cell surface, by means of the sum of the electrical contact areas of all the contact spring sections, all the finger electrodes of the solar cell are electrically contacted by the plurality of contact spring sections. The freely shapeable, looped or hooked integral embodiment of the contact spring sections enables the contacting of all the finger electrodes with a sufficient spring force.

The spring part preferably extends from the lower edge of the measuring strip in an angular fashion, in a rounded arcuate fashion, in a curvate fashion or in an angularly curved fashion. The contact part is predominantly preferably embodied parallel or substantially parallel to the measuring strip extension direction. If the contact part is arranged on a single spring part, the contact spring section is embodied in a hooked fashion because the contact part is secured at one end thereof to the lower edge of the measuring strip by way of the spring part. The other end of the contact part hangs free. The contact part can alternatively be connected to the lower edge of the measuring strip by way of two spring parts. The contact spring section is then embodied in a looped fashion, such that an opening in the material of the measuring strip is formed between the contact part and the lower edge of the measuring strip and the contact spring section forms an elastically deformable loop extending around said opening in the material of the measuring strip. This structurally symmetrical construction affords the advantage of a uniform force input via the contact part to the electrode fingers to be contacted.

The material of the measuring strip and contact spring sections arranged thereon is preferably an electrically conductive material, preferably a metal or a metal alloy. The metal or the metal alloy is preferably corrosion-resistant and has a good electrical conductivity. The measuring strip is preferably a metal sheet from which the contact spring sections embodied integrally with the measuring strip are cut and/or stamped in the form of wires. The material is preferably selected from the group consisting of copper and copper alloys such as Cu, CuBe2, CuZn37 and CuSn6. The modulus of elasticity of the material is preferably in the range of 70000-210000 N/mm$^2$, measured according to DIN EN ISO 6892-1:2017-02. Furthermore, the material preferably has a yield point in the range of 140-1500 N/mm$^2$, measured according to DIN EN ISO 6892-1:2017-02. The modulus of elasticity and the yield point determine the spring force and the maximum spring travel of the contact spring sections.

In one preferred embodiment, each measuring strip is embodied as a metal sheet having a thickness in the range of 0.2 to 1.5 mm, preferably 0.3 to 1.0 mm, more preferably 0.4 to 0.7 mm. This results in significantly reduced optical shading of the solar cell surface during the measurement of electrical characteristics of a solar cell.

Preferably, the contact spring sections are arranged as wire-like elements periodically along the measuring strip extension direction along a lower edge of the measuring strip. This furthermore ensures that the contact spring sections contact all the finger electrodes of the solar cell to be read when the contact spring sections are placed onto the solar cell surface.

The measuring frame furthermore advantageously has a setting device, by means of which the measuring strip can be adjusted in terms of its height and its arrangement along the frame edge struts. By way of example, the frame edge struts and/or a component part secured thereto have/has slotted cutouts in which the component part, a further component part and/or setting screws are arranged in a displaceable manner.

Preferably, the device comprises at least two measuring strips arranged with their measuring strip extension directions parallel to one another, wherein the at least two measuring strips are clamped as a combination measuring strip into the tension device. In other words, the at least two measuring strips are combined to form a combined measuring strip. In one embodiment, the two measuring strips are arranged in a manner electrically insulated from one another. The electrical insulation is realized by an electrically sufficiently insulating film 50 or by paper, for example, which is arranged in a planar fashion in each case between the at least two measuring strips, as shown in FIG. 4. Even more preferably, the device comprises at least three measuring strips which are arranged with their measuring strip extension directions parallel to one another and are electrically insulted from one another, wherein the three measuring strips are clamped as a combination measuring strip into the tension device. This makes it possible to realize, in particular, the 4-conductor measuring technique for reading out the electrical characteristics of the solar cell, this technique being customary in solar cell characterization.

The "4-conductor measuring technique" should be understood to mean 4-point contacting. This measuring technique is usually used to measure small resistances in order to eliminate the resistance of the leads. Current (I) and voltage (U) can thus be measured separately. For measuring purposes, the measuring strips are electrically insulated from one another and clamped as a combination measuring strip into a tension device. In the case of the three measuring strips, for example, the two outer measuring strips can be responsible for carrying away current, said measuring strips being clamped in an offset manner such that, as viewed transversely with respect to the measuring strip extension direction, the contact spring sections are not arranged in an aligned manner, but rather in a manner offset with respect to one another. A redundant electrical contact area on the solar cell surface is realized as a result. The inner measuring strip situated between the two outer current measuring strips is used to measure the voltage. An IUI measurement geometry is thus provided, which can reduce measurement errors in the 4-conductor measuring technique. Besides this exemplary portrayal of the provision of the IUI measurement geometry, other preferred measurement geometries such as IIU, IUIU, IUIUI can also be provided analogously when the at least three measuring strips are used. Measurement errors can moreover still be reduced by means of said measurement geometries.

As described above, two of the measuring strips clamped parallel preferably have contact spring sections arranged offset with respect to one another as viewed perpendicular to the measuring strip extension direction. This ensures that the contact spring sections in their totality make good contact with all the finger electrodes of the solar cell to be read when the contact spring sections are placed onto the solar cell surface, and prevents a situation in which some finger electrodes in regions between two contact spring sections are not, or not sufficiently, electrically contacted.

In one preferred embodiment, the contact spring sections are laser-cut and/or stamped from the measuring strip. In other words, the measuring strip together with the contact spring sections can be produced directly from a metal sheet. This results in cost-effective production of the measuring strips and thus of the device. Moreover, customized designs of the contact spring sections with regard to the structural geometry of spring part and contact part and the elastic spring force being realized can be manufactured simply and comparatively cost-effectively by means of laser cutting.

The invention furthermore relates to a method for measuring electrical characteristics of a solar cell, comprising the following steps:
  providing a device in accordance with one or more of the embodiments described above having a plurality of measuring strips,
  providing a solar cell to be measured having a solar cell surface and finger electrodes arranged on the solar cell surface, and providing a solar cell test device,
  mechanically contacting the finger electrodes on the solar cell surface with the contact spring sections of the measuring strips,
  emitting a flash of light at the solar cell surface,
  tapping off an electric current that is generated by the flash of light and flows through the finger electrodes by means of the contact spring sections of one measuring strip and
  tapping off an electrical voltage as a measurement signal by way of the contact spring sections of the other measuring strip, and
  measuring and evaluating the tapped-off electric current and measuring the tapped-off electrical voltage by means of the solar cell test device.

Explanations given and/or advantages described in respect of the device are applicable, mutatis mutandis, to the method, and vice versa.

Preferably, a number of the measuring strips and the positioning thereof on the solar cell surface of the solar cell to be measured are chosen in such a way that the number and the position of the measuring strips correspond to the number and position of cell connectors 44 between two solar cells 42 to be interconnected to form a solar cell string 40 in a solar module 41, as shown in FIG. 3. As a result, the measuring strips can simulate the cell connectors and the generated shading thereof. As a result, a measurement and evaluation of the electrical characteristics of the solar cell are made possible which largely corresponds to the installation situation in a solar module.

In an additionally preferred embodiment, the thickness T of the measuring strips as viewed transversely with respect to the measuring strip extension direction is chosen so as to correspond to the thickness of the cell connectors 44 used in a solar module 41 that is intended to be constructed from a plurality of the solar cells to be measured which are interconnected to form a solar cell string in said solar module. An even more realistic measurement and evaluation of the electrical characteristics of the solar cell are made possible as a result.

Preferably, each measuring strip is embodied as a combination measuring strip composed of at least three measuring strips which are electrically insulated from one another and which are arranged parallel to one another, wherein at least two of the measuring strips are used for measuring the electric current that is generated by the flash of light and flows through the finger electrodes, and at least one of the measuring strips is used for measuring the electrical voltage generated by the flash of light, as shown in FIG. 2f. The above-described 4-conductor measurement together with its advantages described above is realized as a result.

BRIEF DESCRIPTION OF THE DRAWINGS

Various exemplary embodiments of the invention are illustrated purely schematically in the drawings and are described in greater detail below. In the figures, schematically and not to scale.

FIG. 2a to 2f each show a plan view of different embodiments of measuring strips and combination measuring strips;

DETAILED DESCRIPTION OF THE DRAWINGS

Figure 1:
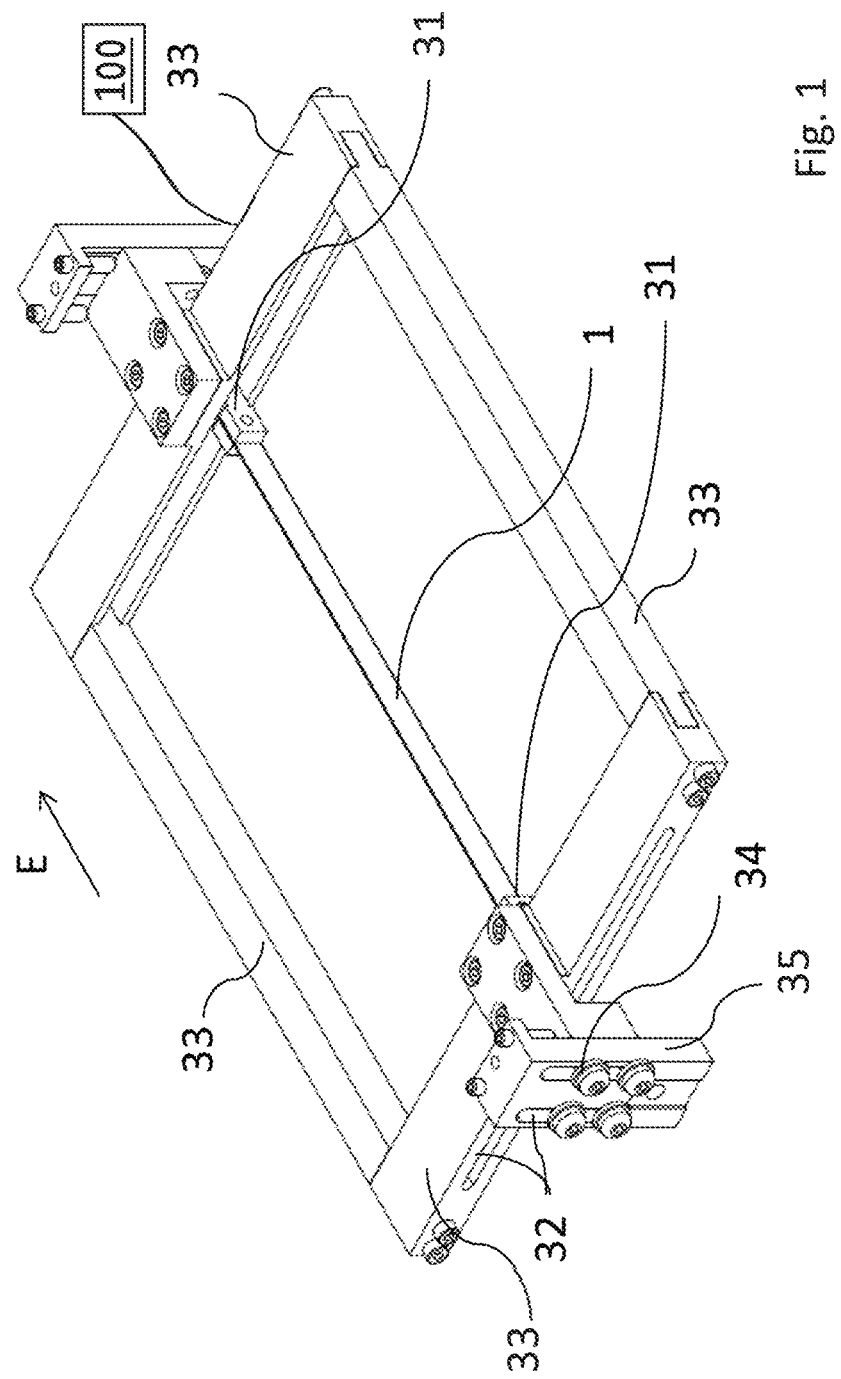
FIG. 1 shows a perspective view of a device according to the invention.
Figure 3:
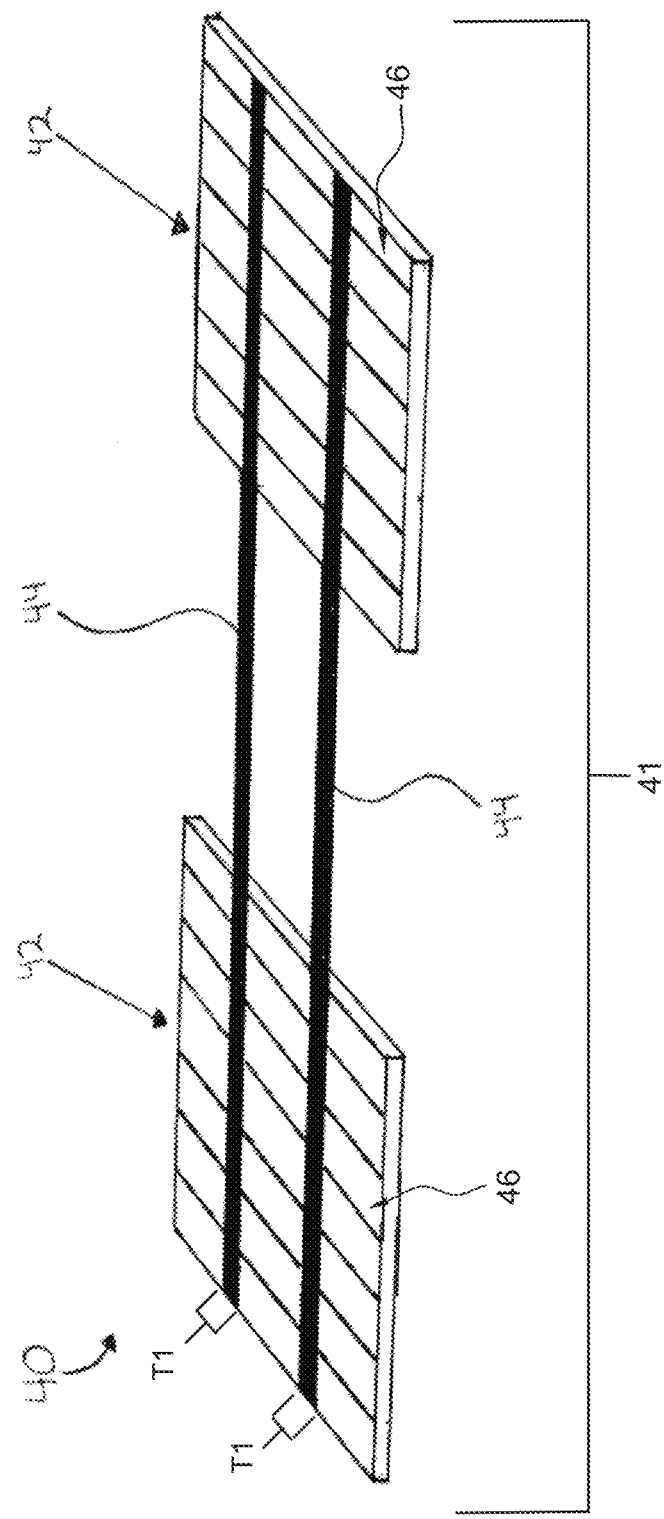
FIG. 3 shows a perspective view of a solar module of a solar cell string according to an aspect of the present invention.
Figure 4:
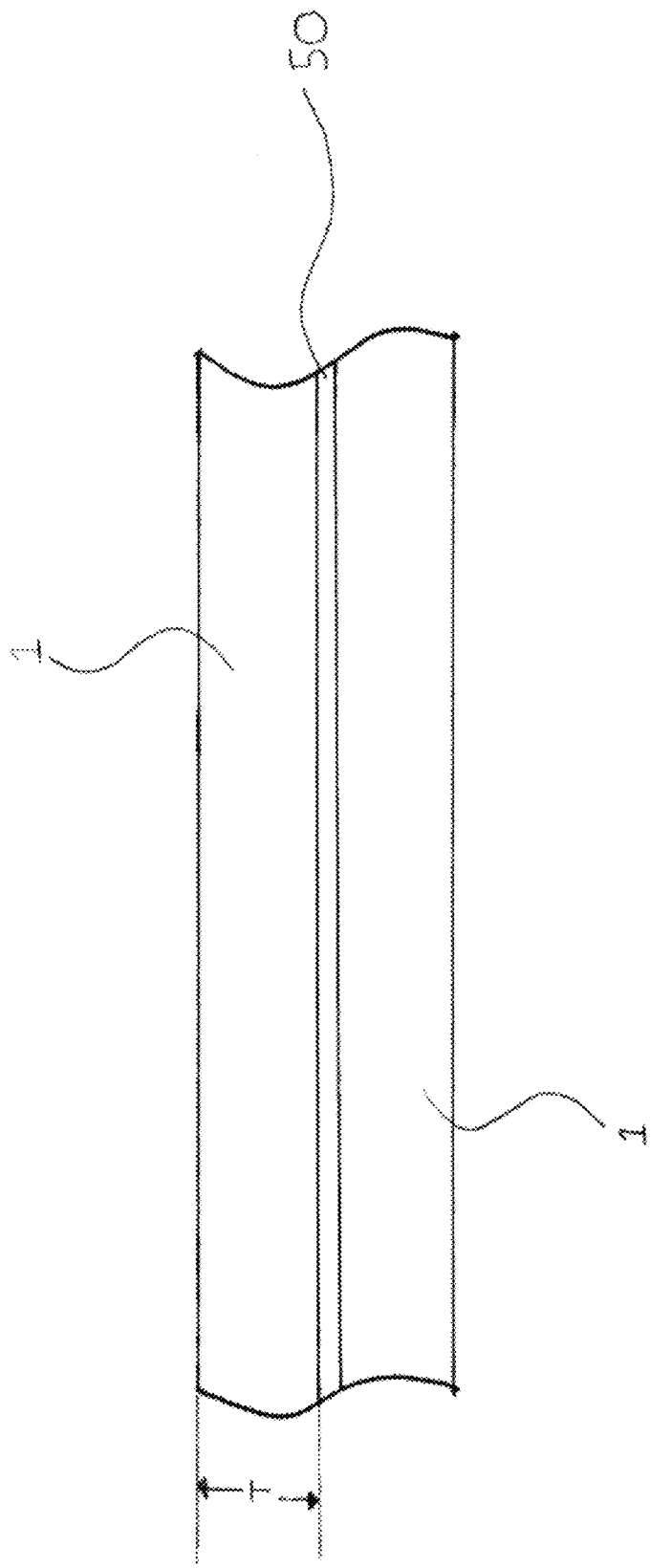
FIG. 4 shows a top-down view of two measuring strips electrically insulated from one another according to an aspect of the present invention.
Figure 5:
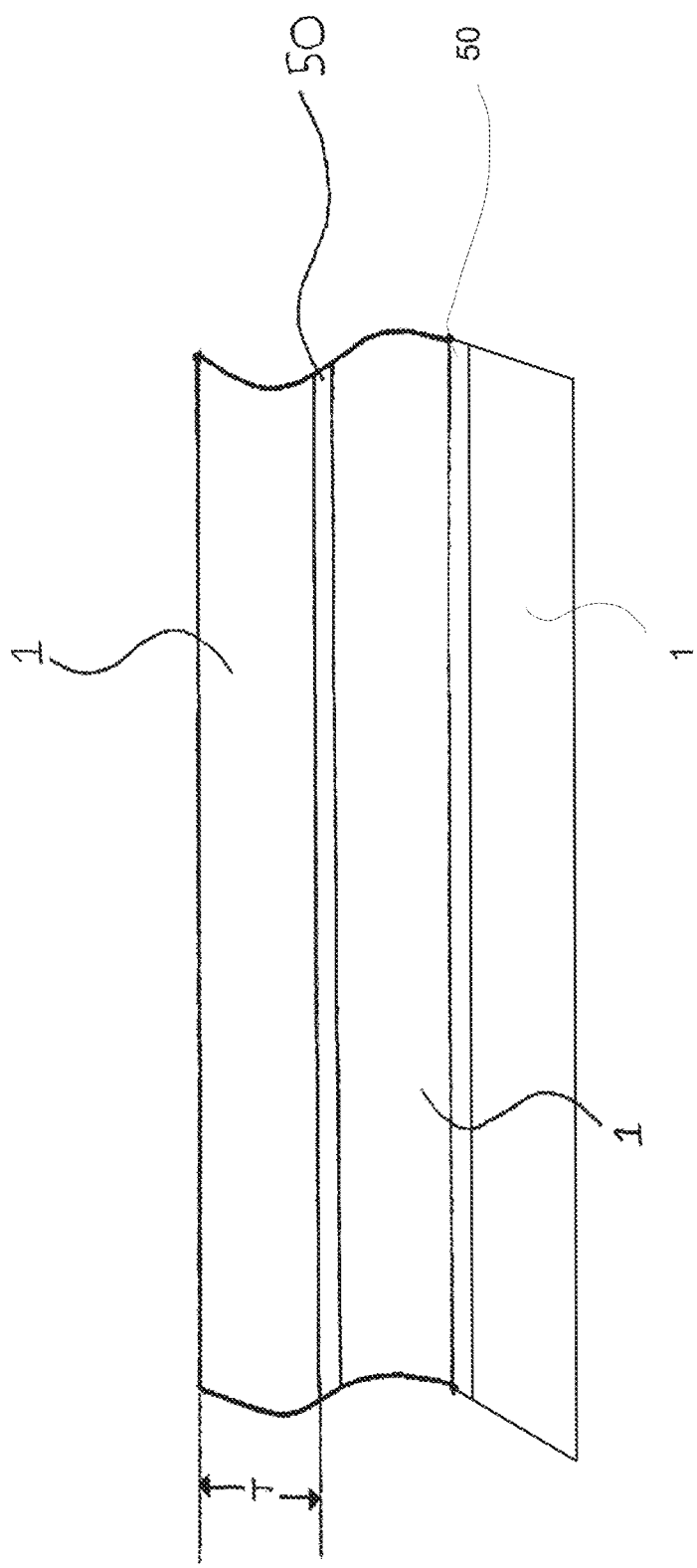
FIG. 5 shows a top-down view of three measuring strips electrically insulated from one another according to an aspect of the present invention.

FIG. 1 shows a perspective view of a device according to the invention for electrically contacting a solar cell (not shown) during the measurement of electrical characteristics of the solar cell, which comprises a multiplicity of finger electrodes 46 on a solar cell surface. The device comprises a measuring strip 1. The measuring strip 1 extends between two measuring strip end sections along a measuring strip extension direction E. The measuring strip 1 has at least one contact terminal (not shown) for electrical contacting with a solar cell test device 100.

The device furthermore comprises a measuring frame 3 having frame edge struts 33 situated opposite one another, which, with the frame edge struts 33, engages around an area that is greater than or equal to a solar cell (not shown) to be measured. The measuring frame 3 has a mechanical tension device 31, in which the measuring strip 1 is clamped under tensile stress between frame edge struts 33 situated opposite one another. For this purpose, the mechanical tension device 31 has a clamping device, in which the measuring strip 1 is clamped. The measuring frame 3 furthermore has a setting device 35 having setting screws 34, by means of which it is furthermore possible in particular to set a height setting of the measuring strip 1 in relation to the frame edge struts 33 in the measuring frame 3. For this purpose, the setting device 35 and the setting screws 34 are displaceable in slotted elongate holes 32.

A plurality of contact spring sections 2 are arranged on the lower edge of the measuring strip 1 along the measuring strip extension direction E. This is shown in detail in FIGS. 2a to 2e. Each contact spring section 2 is configured to electrically contact at least one finger electrode by spring-elastic mechanical contact when the measuring strip 1 is placed onto the solar cell surface, with the measuring strip extension direction E oriented transversely with respect to the finger electrodes. The measuring strip 1 with the contact spring sections 2 is embodied from the same material and the measuring strip 1 is embodied integrally with the contact spring sections 1 arranged on its lower edge. Each contact spring section 2 is embodied in a looped or hooked fashion as viewed transversely with respect to the measuring strip extension direction E.

During operation of the device, the solar cell 42 to be measured having a solar cell surface and finger electrodes 46 arranged on the solar cell surface is provided and a solar cell test device 100 is provided, which is connected to the measuring strip 1. The finger electrodes 46 on the solar cell surface are contacted with the contact spring sections 2 of the measuring strip 1. A flash of light is emitted at the solar cell surface. An electric current that is generated by the flash of light and flows through the finger electrodes 46 is tapped off by means of the contact spring sections 2 of one measuring strip 1 and an electrical voltage is tapped off as a measurement signal via the contact spring sections 2 of a further measuring strip (not shown). The tapped-off electric current and the tapped-off electrical voltage are measured and evaluated by means of the solar cell test device 100.

FIGS. 2a to 2e each show a plan view of different embodiments of measuring strips and combination measuring strips which can be used in the device shown in FIG. 1.

FIG. 2a shows a plan view of a measuring strip as viewed transversely with respect to the measuring strip extension direction E. The measuring strip 1 has two fixing openings 11. By means of the fixing openings 11, the measuring strip 1 can be fixed in the mechanical tension device 31 shown in FIG. 1. The measuring strip 1 has the plurality of contact spring sections 2 arranged adjacent to one another as wire-like elements periodically along the measuring strip extension direction E along the lower edge of the measuring strip 1. Each contact spring section 2 has two spring parts 22, which, proceeding from the lower edge of the measuring strip 1, are arranged transversely with respect thereto and are connected to one another by a contact part 21. As a result, each contact spring section 2 is embodied in a looped fashion as viewed transversely with respect to the measuring strip extension direction E.

FIG. 2b shows a plan view of a combination measuring strip, formed from two measuring strips 1 in accordance with FIG. 2a. Two identical measuring strips 1 are arranged parallel to one another along their measuring strip extension directions E but offset in such a way that the contact spring sections 2 are not arranged in flush alignment, but rather in a manner offset with respect to one another. The two measuring strips 1 can be mounted in a manner electrically insulated from one another.

FIG. 2c shows a plan view of a further embodiment of a measuring strip as viewed transversely with respect to the measuring strip extension direction E. The measuring strip 1 shown in FIG. 2c corresponds to the measuring strip shown in FIG. 2a with the difference that each contact spring section 2 is embodied in a hooked fashion, rather than in a looped fashion, as viewed transversely with respect to the measuring strip extension direction E. Each contact spring section 2 has only a single spring part 22, which is connected to a respective contact part 21 extending from the lower edge of the measuring strip.

FIG. 2d shows a plan view of a further combination measuring strip formed from two measuring strips 1 in accordance with FIG. 2a. Two identical measuring strips 1 are arranged parallel to one another along their measuring strip extension directions E but offset in such a way that the contact spring sections 2 are not arranged in flush alignment, but rather in a manner offset with respect to one another. The two measuring strips 1 can be mounted in a manner electrically insulated from one another.

FIG. 2e shows a plan view of a further embodiment of a measuring strip as viewed transversely with respect to the measuring strip extension direction E. The measuring strip 1 shown in FIG. 2e corresponds to the measuring strip shown in FIG. 2a with the difference that the contact spring sections 2 are formed by slotted holes arranged in the lower edge of the measuring strip. As a result, the loop of the looped contact spring sections 2 is significantly smaller than the loop shown in FIG. 2a.

LIST OF REFERENCE SIGNS

E Measuring strip extension direction
1 Measuring strip
11 Fixing opening
2 Contact spring section
21 Contact part
22 Spring part
3 Measuring frame
31 Mechanical tension device
32 Elongate holes
33 Frame edge struts
34 Setting screws
35 Setting device
40 Solar cell string
41 Solar module
42 Solar cells
44 Cell connectors
46 Finger electrodes
50 Insulator
T Thickness

The invention claimed is:

1. A device for electrically contacting a solar cell during the measurement of electrical characteristics of the solar cell, wherein the solar cell is embodied with a multiplicity of finger electrodes on a solar cell surface, the device comprising:

at least one measuring strip extending between two measuring strip end sections in a measuring strip extension direction, wherein the at least one measuring strip has at least one contact terminal for electrical contacting with a solar cell test device;

a plurality of contact spring sections arranged on the at least one measuring strip along the measuring strip extension direction, wherein each contact spring section is configured to electrically contact at least one finger electrode of the multiplicity of finger electrodes by spring-elastic mechanical contact when the at least one measuring strip is placed onto the solar cell surface, with the measuring strip extension direction oriented transversely with respect to the multiplicity of finger electrodes; and a measuring frame having frame edge struts situated opposite one another, which, with the frame edge struts, engages around an area that is greater than or equal to a solar cell to be measured, wherein the at least one measuring strip and the contact spring sections are formed from a same material and integrally, wherein each contact spring section is embodied in a looped or hooked fashion as viewed transversely with respect to the at least one measuring strip extension direction, and the measuring frame has a mechanical tension device, in which the at least one measuring strip is clamped under tensile stress between the frame edge struts situated opposite one another, the tensile stress being applied in the measuring strip extension direction, such that the measuring strip is fixed between the frame edge struts.

2. The device according to claim 1, wherein each measuring strip of the at least one measuring strip is formed as a metal sheet having a thickness in a range of 0.2 to 1.5 mm.

3. The device according to claim 1, wherein the contact spring sections are arranged as wire-like elements periodically along the measuring strip extension direction along a lower edge of the at least one measuring strip.

4. The device according to claim 1, wherein the at least one measuring strip comprises at least two measuring strips arranged with measuring strip extension directions thereof parallel to one another, and wherein the at least two measuring strips are clamped as a combination measuring strip into the mechanical tension device.

5. The device according to claim 4, the at least two measuring strips are arranged in a manner electrically insulated from one another.

6. The device according to claim 4, wherein two of the at least two measuring strips clamped parallel have contact spring sections arranged offset with respect to one another as viewed perpendicular to the measuring strip extension direction.

7. The device according to claim 1, wherein the contact spring sections are laser-cut and/or stamped from the at least one measuring strip.

8. A method for measuring electrical characteristics of a solar cell, comprising the following steps:
providing a device according to claim 1, wherein the at least one measuring strip comprises a plurality of measuring strips;
providing a solar cell to be measured having a solar cell surface and finger electrodes arranged on the solar cell surface and providing a solar cell test device;
mechanically contacting the finger electrodes on the solar cell surface with the contact spring sections of the plurality of measuring strips;
emitting a flash of light at the solar cell surface;
tapping off an electric current that is generated by the flash of light and flows through the finger electrodes by means of the contact spring sections of a first measuring strip of the plurality of measuring strips;
tapping off an electrical voltage as a measurement signal by way of the contact spring sections of a second measuring strip of the plurality of measuring strips; and
measuring and evaluating the tapped-off electric current and measuring the tapped-off electrical voltage by means of the solar cell test device.

9. The method according to claim 8, wherein a number of the plurality of measuring strips and the positioning thereof on the solar cell surface of the solar cell to be measured are chosen in such a way that the number and the position of the plurality of measuring strips correspond to the number and position of cell connectors between two solar cells to be interconnected to form a solar cell string.

10. The method according to claim 9, wherein the thickness of the plurality of measuring strips as viewed transversely with respect to the measuring strip extension direction is chosen so as to correspond to the thickness of the cell connectors used in a solar module that is intended to be constructed from a plurality of the solar cells to be measured which are interconnected to form a solar cell string in said solar module.

11. The method according to claim 9, wherein each measuring strip of the plurality of measuring strips is formed as a combination measuring strip composed of at least three measuring strips of the plurality of measuring strips which are electrically insulated from one another and which are arranged parallel to one another, wherein at least two of the measuring strips of the plurality of measuring strips are used for measuring the electric current that is generated by the flash of light and flows through the finger electrodes, and at least one of the measuring strips of the plurality of measuring strips is used for measuring the electrical voltage generated by the flash of light.

12. The device according to claim 1, wherein each measuring strip of the at least one measuring strip is formed as a metal sheet having a thickness in a range of 0.3 to 1.0 mm.

13. The device according to claim 1, wherein each measuring strip of the at least one measuring strip is formed as a metal sheet having a thickness in a range of 0.4 to 0.7 mm.

14. The device according to claim 1, wherein the mechanical tension device further comprises a clamping portion movably connected to a setting device, wherein the measuring strip is clamped under tensile stress between the frame edge struts by the clamping portion, and wherein a vertical movement of the clamping portion is controlled via the setting device.

\* \* \* \* \*